(12) United States Patent
Watanabe et al.

(10) Patent No.: US 10,009,020 B2
(45) Date of Patent: Jun. 26, 2018

(54) SIGNAL CONVERTER CIRCUIT, DISPLAY DEVICE, AND ELECTRONIC DEVICE

(71) Applicant: Semiconductor Energy Laboratory Co., Ltd., Kanagawa-ken (JP)

(72) Inventors: Kazunori Watanabe, Kanagawa (JP); Hiroyuki Miyake, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 143 days.

(21) Appl. No.: 13/716,885

(22) Filed: Dec. 17, 2012

(65) Prior Publication Data

US 2013/0162613 A1 Jun. 27, 2013

(30) Foreign Application Priority Data

Dec. 23, 2011 (JP) .................................. 2011-282430

(51) Int. Cl.
*G09G 3/36* (2006.01)
*H03K 17/04* (2006.01)
*G09G 5/00* (2006.01)

(52) U.S. Cl.
CPC ........... *H03K 17/04* (2013.01); *G09G 3/3648* (2013.01); *G09G 3/3688* (2013.01); *G09G 3/3696* (2013.01); *G09G 5/001* (2013.01)

(58) Field of Classification Search
CPC ... C02F 1/13; G09G 3/18; G09G 3/36; G09G 3/3688; G11C 27/026
USPC ........ 345/87, 98, 208, 100; 350/332; 327/91
See application file for complete search history.

(56) References Cited

U.S. PATENT DOCUMENTS

| 4,781,437 A | * | 11/1988 | Shields et al. ................... 345/87 |
| 5,311,072 A | * | 5/1994 | Matsui ................. G11C 27/026 327/91 |
| 6,184,855 B1 | * | 2/2001 | Kobayashi ........... G09G 3/3648 345/100 |
| 7,663,580 B2 | | 2/2010 | Shin |
| 8,243,873 B2 | | 8/2012 | Koyama et al. |
| 8,363,778 B2 | | 1/2013 | Koyama et al. |
| 8,582,716 B2 | | 11/2013 | Koyama et al. |
| 8,957,881 B2 | | 2/2015 | Wakimoto et al. |

(Continued)

FOREIGN PATENT DOCUMENTS

| EP | 1 610 293 A2 | 12/2005 |
| JP | 4-11399 | 1/1992 |

(Continued)

*Primary Examiner* — Abdul-Samad A Adediran
(74) *Attorney, Agent, or Firm* — Husch Blackwell LLP

(57) ABSTRACT

To suppress an adverse effect of change in held data in a sample-and-hold circuit as a result of increase in operation speed on a generated parallel data signal. A signal converter circuit includes a first sample-and-hold circuit and a second sample-and-hold circuit each of which has a function of extracting and holding part of a serial data signal as a data in accordance with a sampling control signal and has a function of generating a data signal which is one of data signals of a parallel data signal by using the held data and outputting the data signal. The second sample-and-hold circuit includes a switch which has a function of selecting whether the potential of the data of the second sample-and-hold circuit is set to a reference potential or not in accordance with the sampling control signal of the first sample-and-hold circuit.

13 Claims, 10 Drawing Sheets

(56) References Cited

U.S. PATENT DOCUMENTS

| | | |
|---|---|---|
| 9,406,398 B2 | 8/2016 | Koyama et al. |
| 9,443,482 B2 | 9/2016 | Wakimoto et al. |
| 2005/0206598 A1* | 9/2005 | Yamazaki et al. .............. 345/87 |
| 2006/0214900 A1* | 9/2006 | Tsuchi ................. G09G 3/3688 345/98 |
| 2010/0110623 A1 | 5/2010 | Koyama et al. |
| 2016/0379582 A1 | 12/2016 | Wakimoto et al. |
| 2017/0026039 A1 | 1/2017 | Koyama et al. |

FOREIGN PATENT DOCUMENTS

| | | |
|---|---|---|
| JP | 06-266314 A | 9/1994 |
| JP | 10-097223 A | 4/1998 |
| JP | 10-097224 A | 4/1998 |
| JP | 11-202296 A | 7/1999 |
| JP | 11-326867 A | 11/1999 |
| JP | 2000-98981 | 4/2000 |
| JP | 2001-075535 A | 3/2001 |
| JP | 2006-011368 A | 1/2006 |
| JP | 2008-216425 A | 9/2008 |
| JP | 2010-135762 A | 6/2010 |
| JP | 2011-090761 A | 5/2011 |
| JP | 2011-170329 A | 9/2011 |
| WO | WO 2010/050419 A1 | 5/2010 |
| WO | WO 2011/036993 A1 | 3/2011 |
| WO | WO 2011/089833 A1 | 7/2011 |

* cited by examiner

SIGNAL CONVERTER CIRCUIT, DISPLAY DEVICE, AND ELECTRONIC DEVICE

BACKGROUND OF THE INVENTION

1. Field of the Invention

The present invention relates to a signal converter circuit, a display device including the signal converter circuit, and an electronic device provided with a panel including the display device.

2. Description of the Related Art

In recent years, with the widespread use of smartphones, tablet terminals, and the like, display devices used for panels of these products have been actively developed.

In order to improve image quality of the display devices, for example, the display devices preferably have high definition. However, as the display devices have high definition, the number of pixels where rewriting operation of data is performed is increased; therefore, the operation speed needs to be increased. Further, as the display devices have high definition, the number of kinds of data signals which are generated from video data signals and input to pixels is also increased.

One example of a method for transmitting a video data signal is a method of converting a video data signal which is a serial data signal into a parallel data signal. By employing the above method, for example, the number of kinds of data signals used for a display device can be reduced.

In order to convert a serial data signal into a parallel data signal, a signal converter circuit is used, for example. The signal converter circuit includes a plurality of sample-and-hold circuits each including a switch, a capacitor, and an amplifier circuit, for example (e.g. Patent Document 1).

A signal converter circuit disclosed in Patent Document 1 has a function of sequentially extracting (also referred to as sampling) part of a serial data signal as data and holding it to generate a data signal which is part of a parallel data signal by using the held data and output the data signal by a plurality of sample-and-hold circuits.

REFERENCE

Patent Document

[Patent Document 1] Japanese Published Patent Application No. 2000-98981

SUMMARY OF THE INVENTION

With increase in operation speed of a display device, when the sampling rate of the plurality of sample-and-hold circuits becomes higher, a data signal (also referred to as output data signal) which is output from each sample-and-hold circuit is delayed with respect to a data signal which is input to each sample-and-hold circuit in a conventional signal converter circuit. For example, when the sample-and-hold circuit is operated at high speed at a sampling rate of 15 ns or less, the output data signal is delayed by several hundred nanoseconds or more in some cases. In the sample-and-hold circuit, the output data signal is in a transient state even after sampling due to the delay of the output data signal.

Since a node whose potential is the held data is in a floating state at this time, the value of the potential of the held data in the sample-and-hold circuits is changed in accordance with change in the potential of the output data signal in a transient state. One of the causes of change in the held data, for example, is change in the potential due to the parasitic capacitance of a transistor provided in an input portion of an amplifier circuit included in a sample-and-hold circuit. The potential of a gate of the transistor is changed in accordance with the potential of the held data, and the potential of a source or a drain of the transistor is changed in accordance with the potential of the output data signal. When a parasitic capacitance exists between the gate and the source of the transistor or between the gate and the drain of the transistor, the potential of the gate of the transistor is changed by capacitive coupling of the parasitic capacitance in accordance with change in the potential of the source or the drain of the transistor, and thus the potential of the held data is changed.

By the change in the held data, the value of the potential of each data signal in a parallel data signal which is generated is deviated from a desired value, which causes a problem in that a display device cannot accurately display an image based on a video data signal, for example.

Further, the amount of change in the held data depends on not only the value of a potential of a serial data signal to be sampled but also the value of a potential of the held data before sampling. For example, in the case where the serial data signal is an analog signal, the amount of change in the held data after sampling differs according to whether the potential of the held data before sampling is 0 V or 2.5 V although the potential of the serial data signal to be sampled is 2V in both cases.

As described above, in the case where variation in the amount of change in the held data is large due to the value of the potential of the held data before sampling, the change in the held data cannot be ignored. In addition, it is difficult to adjust the serial data signal in accordance with the amount of change in the held data in advance.

In view of the foregoing problems, an object of one embodiment of the present invention is to suppress an adverse effect of change in held data in a sample-and-hold circuit as a result of increase in operation speed on a generated parallel data signal.

For example, an object of one embodiment of the present invention is to reduce variation in the amount of change in held data in the sample-and-hold circuit as a result of increase in operation speed.

In one embodiment of the present invention, a switch which selects whether or not the potential of held data in a sample-and-hold circuit is set to a reference potential is provided.

In the sample-and-hold circuit, the potential of the held data is set to the reference potential before sampling of the serial data signal, whereby the amount of change in the held data is determined not by the value of the potential of the held data before sampling but by the value of the potential of the serial data signal which is subjected to sampling. Thus, variation in the amount of change in the held data in the sample-and-hold circuit as a result of increase in operation speed is reduced. When variation in the amount of change in the held data is reduced, the change in the held data can be ignored, or the serial data signal can be easily adjusted in accordance with the amount of change in the held data.

Further, in one embodiment of the present invention, the on/off state of the switch is controlled by one of a plurality of sampling control signals which are used for control of a sampling operation in the sample-and-hold circuit. By employing this structure, the potential of held data in one sample-and-hold circuit can be set to the reference potential while sampling is performed in another sample-and-hold circuit, which suppresses increase in operation time and decrease in operation speed.

One embodiment of the present invention is a signal converter circuit including a first sample-and-hold circuit which has a function of extracting and holding part of a serial data signal as first data in accordance with a first sampling control signal and has a function of generating a first data signal which is one of data signals of a parallel data signal by using the held first data and outputting the first data signal; and a second sample-and-hold circuit which has a function of extracting and holding part of the serial data signal as second data in accordance with a second sampling control signal and has a function of generating a second data signal which is one of the data signals of the parallel data signal by using the held second data and outputting the second data signal. The second sample-and-hold circuit includes a switch which has a function of selecting whether the potential of the second data is set to a reference potential or not in accordance with the first sampling control signal.

Another embodiment of the present invention is a signal converter circuit including a first sample-and-hold circuit which has a function of extracting and holding part of a serial data signal as first data in accordance with a first sampling control signal and has a function of generating a first data signal which is one of data signals of a parallel data signal by using the held first data and outputting the first data signal; a second sample-and-hold circuit which has a function of extracting and holding part of the serial data signal as second data in accordance with a second sampling control signal and has a function of generating a second data signal which is one of the data signals of the parallel data signal using the held second data and outputting the second data signal; a third sample-and-hold circuit which has a function of extracting and holding part of the serial data signal as third data in accordance with a third sampling control signal and has a function of generating a third data signal which is one of the data signals of the parallel data signal by using the held third data and outputting the third data signal; and a logic circuit which generates and outputs a fourth sampling control signal whose potential is a logical OR of the first sampling control signal and the second sampling control signal. The third sample-and-hold circuit includes a switch having a function of selecting whether the potential of the third data is set to a reference potential or not in accordance with the fourth sampling control signal.

Another embodiment of the present invention is a display device including a signal converter circuit which is supplied with a video data signal as a serial data signal and converts the video data signal into a plurality of data signals which is a parallel data signal and outputs the plurality of data signals; a source driver which is supplied with the plurality of data signals and has a function of outputting the plurality of input data signals sequentially; a gate driver which has a function of generating and outputting a plurality of gate signals; a plurality of pixel circuits to each of which one of the plurality of data signals is input in accordance with one of the plurality of gate signals; and a control circuit which controls operation of the signal converter circuit, the source driver, and the gate driver. The signal converter circuit includes a first sample-and-hold circuit which has a function of extracting and holding part of a serial data signal as first data in accordance with a first sampling control signal and has a function of generating a first data signal which is one of the plurality of data signals of a parallel data signal by using the held first data and outputting the first data signal; a second sample-and-hold circuit which has a function of extracting and holding part of the serial data signal as second data in accordance with a second sampling control signal and has a function of generating a second data signal which is one of the plurality of data signals of the parallel data signal by using the held second data and outputting the second data signal; and a shift register which generates and outputs the first sampling control signal and the second sampling control signal. The second sample-and-hold circuit includes a switch having a function of selecting whether the potential of the second data is set to a reference potential or not in accordance with the first sampling control signal.

Another embodiment of the present invention is a display device including a signal converter circuit which is supplied with a video data signal as a serial data signal and converts the video data signal into a plurality of data signals which is a parallel data signal and outputs the plurality of data signals; a source driver which is supplied with the plurality of data signals and has a function of outputting the plurality of input data signals sequentially; a gate driver which has a function of generating and outputting a plurality of gate signals; a plurality of pixel circuits to each of which one of the plurality of data signals is input in accordance with one of the plurality of gate signals; and a control circuit which controls operation of the signal converter circuit, the source driver, and the gate driver. The signal converter circuit includes a first sample-and-hold circuit which has a function of extracting and holding part of a serial data signal as first data in accordance with a first sampling control signal and has a function of generating a first data signal which is one of the plurality of data signals of a parallel data signal by using the held first data and outputting the first data signal; a second sample-and-hold circuit which has a function of extracting and holding part of the serial data signal as second data in accordance with a second sampling control signal and has a function of generating a second data signal which is one of the plurality of data signals of the parallel data signal by using the held second data and outputting the second data signal; a third sample-and-hold circuit which has a function of extracting and holding part of the serial data signal as third data in accordance with a third sampling control signal and has a function of generating a third data signal which is one of the plurality of data signals of the parallel data signal by using the held third data and outputting the third data signal; a logic circuit which generates and outputs a fourth sampling control signal whose potential is a logical OR of the first sampling control signal and the second sampling control signal; and a shift register which generates and outputs the first, second, and third sampling control signals. The third sample-and-hold circuit includes a switch having a function of selecting whether the potential of the third data is set to a reference potential or not in accordance with the fourth sampling control signal.

Note that in the display device of one embodiment of the present invention, the signal converter circuit, the source driver, the gate driver, the plurality of pixel circuits, and the control circuit may be provided over one substrate.

Another embodiment of the present invention is an electronic device including a panel including the display device.

According to one embodiment of the present invention, an adverse effect of change in the held data in the sample-and-hold circuit as a result of increase in operation speed on the generated parallel data signal can be suppressed.

For example, variation in the amount of change in the held data of the sample-and-hold circuit as a result of increase in operation speed can be made small, so that change in the held data can be ignored, or adjustment of the serial data signal corresponding to the amount of change in the held data can be easily performed. This suppresses an adverse effect on the generated parallel data signal.

DETAILED DESCRIPTION OF THE INVENTION

Embodiments of the present invention will be described. Note that it will be readily appreciated by those skilled in the art that details of the embodiments can be modified in various ways without departing from the spirit and scope of the present invention. Thus, the present invention should not be limited to, for example, the description of the following embodiments.

Note that the contents in different embodiments can be combined with one another as appropriate. In addition, the contents of the embodiments can be replaced with each other as appropriate.

Further, the ordinal numbers such as "first" and "second" are used to avoid confusion between components and do not limit the number of each component.

Embodiment 1

In this embodiment, an example of a signal converter circuit which can covert a serial data signal into a parallel data signal will be described with reference to FIG. 1, FIG. 2, FIGS. 3A to 3C, FIG. 4, and FIG. 5.

Figure 1:
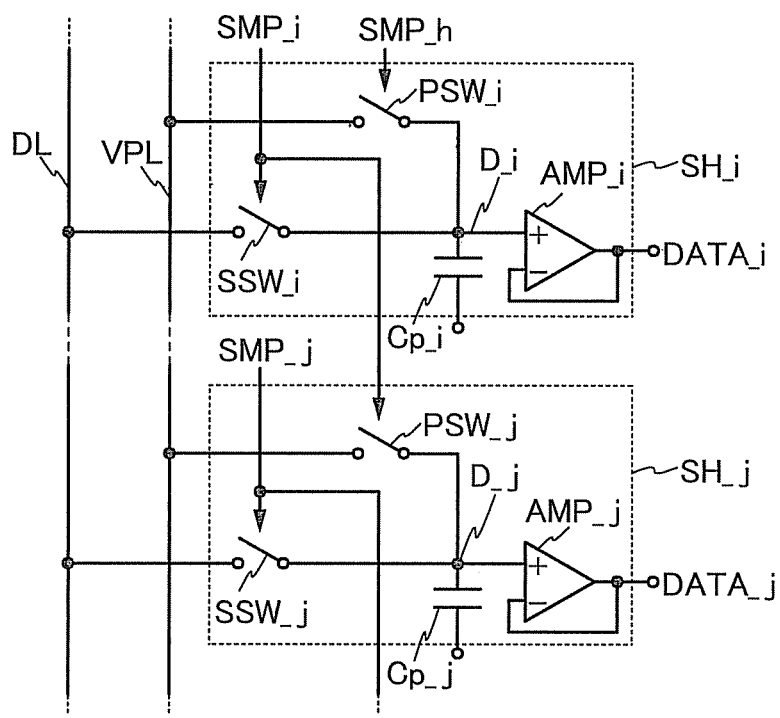
FIG. 1 illustrates an example of a signal converter circuit.

FIG. 1 illustrates an example of a circuit configuration of a signal converter circuit in this embodiment.

The signal converter circuit illustrated in FIG. 1 includes a plurality of sample-and-hold circuits SH (including a sample-and-hold circuit SH_i and a sample-and-hold circuit SH_j). It is preferable that the sample-and-hold circuit SH_i and the sample-and-hold circuit SH_j be sequentially arranged. However, an embodiment of the present invention is not limited thereto, and for example, another sample-and-hold circuit may be provided between the sample-and-hold circuit SH_i and the sample-and-hold circuit SH_j.

The plurality of sample-and-hold circuits SH have a function of extracting (sampling) and holding part of a serial data signal input through a data signal line DL, as data D, in accordance with respective sampling control signals. For example, the sample-and-hold circuit SH_i extracts and holds part of a serial data signal as data D_i in accordance with a sampling control signal SMP_i, and the sample-and-hold circuit SH_j extracts and holds part of the serial data signal as data D_j in accordance with a sampling control signal SMP_j. Note that a serial data signal is preferably, for example, an analog signal.

The plurality of sample-and-hold circuits SH each include a switch SSW, a capacitor Cp, an amplifier circuit AMP, and a switch PSW. For example, the sample-and-hold circuit SH_i includes a switch SSW_i, a capacitor Cp_i, an amplifier circuit AMP_i, and a switch PSW_i, and the sample-and-hold circuit SH_j includes a switch SSW_j, a capacitor Cp_j, an amplifier circuit AMP_j, and a switch PSW_j. Note that it is not necessary to provide the switch PSW in all the sample-and-hold circuits SH; for example, at least one of the sample-and-hold circuit SH_i and sample-and-hold circuit SH_j may include the switch PSW.

The switch SSW has a function of extracting part of a serial data signal input through the data signal line DL and controlling whether or not the part of the serial data signal is held as data D in accordance with the sampling control signal SMP. The switch SSW can be formed using, for example, a field-effect transistor. In this case, a potential of a gate of the field-effect transistor is changed by the sampling control signal SMP, whereby the switch SSW can be turned on or off. An example of the switch formed using a field-effect transistor is an analog switch.

The potential of one of a pair of electrodes of the capacitor Cp is equal to that of the data D, and the other of the pair of electrodes of the capacitor Cp is set to a ground potential. The capacitor Cp functions as a storage capacitor for holding the data D.

The amplifier circuit AMP includes a positive input terminal, a negative input terminal, and an output terminal. The potential of the positive input terminal of the amplifier circuit AMP is equal to that of the data D. The negative input terminal and the output terminal are connected to each other. The amplifier circuit AMP has a function of generating and outputting a data signal DATA corresponding to the potential of the data D. For example, the amplifier circuit AMP_i outputs a data signal DATA_i which is part of a parallel data signal, and the amplifier circuit AMP_j outputs a data signal DATA_j which is part of the parallel data signal. The amplifier circuit AMP can be formed using, for example, an operational amplifier.

The switch PSW has a function of controlling whether the potential of the data D is set to a reference potential VR or not in accordance with the sampling control signal SMP used for controlling a sampling operation of another sample-and-hold circuit SH. The value of the reference potential VR depends on a potential applied through a reference potential line VPL. The reference potential VR is preferably constant. For example, the reference potential VR is preferably set between the highest potential and the lowest potential of the serial data signal.

For example, the switch PSW_i has a function of controlling whether the potential of the data D_i is set to the reference potential VR or not in accordance with the sampling control signal SMP_h, and the switch PSW_j has a function of controlling whether the potential of the data D_j is set to the reference potential VR or not in accordance with the sampling control signal SMP_i.

Further, the switch PSW can be formed using, for example, a field-effect transistor, like the switch SSW. In this case, the switch PSW can be turned on or off by changing a potential of a gate of the field-effect transistor by the sampling control signal SMP. An example of the switch formed using a field-effect transistor is an analog switch. For example, the switch PSW preferably has the same structure as the switch SSW.

The switch PSW is controlled using the sampling control signal SMP, whereby the potential of the data D in one sample-and-hold circuit SH can be set to the reference potential while sampling is performed in another sample-and-hold circuit SH. Thus, it is not necessary to additionally provide a period for setting the potential of the data D in the one sample-and-hold circuit SH to the reference potential, which suppresses increase in operation time. Accordingly, reduction in operation speed can be suppressed.

Figure 2:
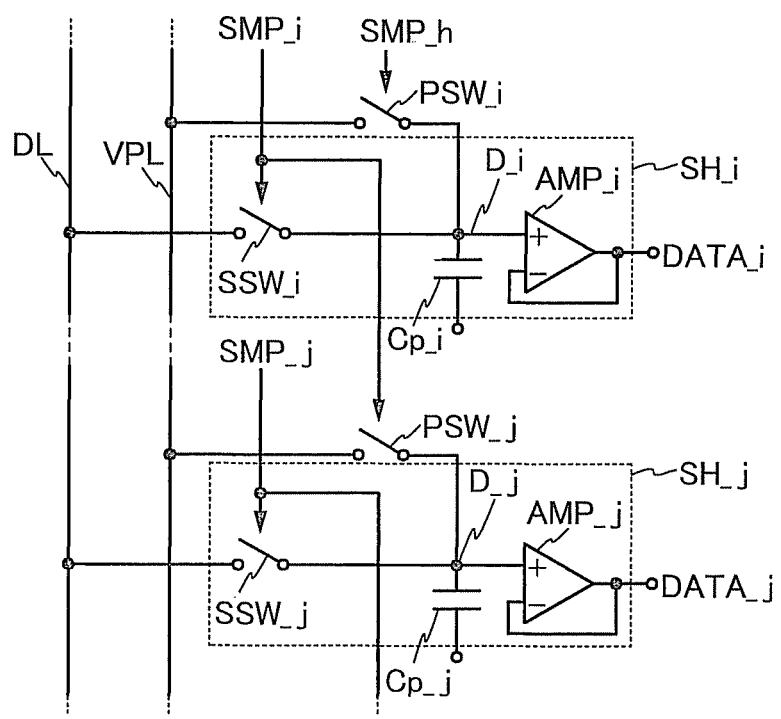
FIG. 2 illustrates an example of a signal converter circuit.

Note that an embodiment of the present invention is not limited to a structure in which the sample-and-hold circuit SH includes the switch PSW. For example, as illustrated in FIG. 2, a structure in which the switch PSW is provided outside the sample-and-hold circuit SH may be employed.

Figure 3A:
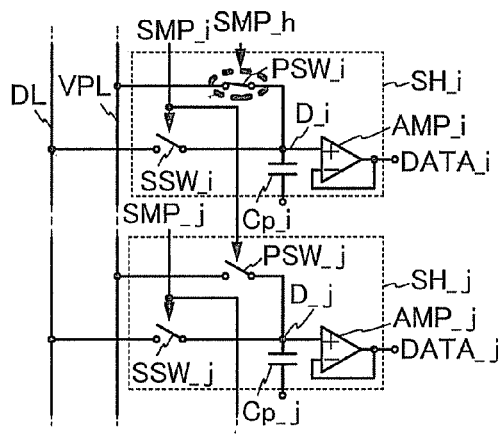
FIGS. 3A to 3C illustrate an example of a method for driving a signal converter circuit.
Figure 3B:
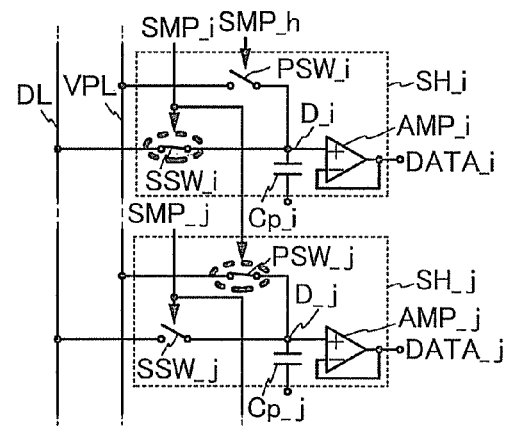
Figure 3C:
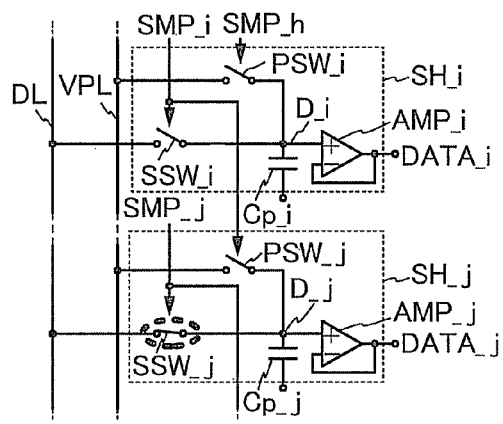

Next, as an example of a method for driving the signal converter circuit of this embodiment, an example of a method for driving the signal converter circuit illustrated in FIG. 1 will be described with reference to FIGS. 3A to 3C. FIGS. 3A to 3C illustrate an operation example of the signal converter circuit in FIG. 1.

In the example of the method for driving the signal converter circuit in FIG. 1, in each of the sample-and-hold circuits SH, the potential of the held data D is set to the reference potential VR, and after that, part of the serial data signal is extracted and held as data in accordance with the plurality of sampling control signals SMP.

For example, as illustrated in FIG. 3A, first, a pulse of the sampling control signal SMP_h is input to the signal converter circuit, whereby the switch PSW_i of the sample-and-hold circuit SH_i is turned on.

At this time, the potential of the data D_i of the sample-and-hold circuit SH_i is set to the reference potential VR.

Then, after the input of the pulse of the sampling control signal SMP_h ends, the switch PSW_i is turned off, so that the potential of the data D_i is held at the reference potential VR.

Next, as illustrated in FIG. 3B, a pulse of the sampling control signal SMP_i is input to the signal converter circuit, whereby the switch SSW_i of the sample-and-hold circuit SH_i is turned on and the switch PSW_j of the sample-and-hold circuit SH_j is turned on.

At this time, the value of the potential of the data D_i of the sample-and-hold circuit SH_i is equal to that of the potential of the data signal line DL. The potential of the serial data signal at this time is denoted by a potential D1.

Further, at this time, the potential of the data D_j of the sample-and-hold circuit SH_j is set to the reference potential VR.

Then, after the input of the pulse of the sampling control signal SMP_i ends, the switch SSW_i is turned off, so that a node whose potential is the data D_i is brought into a floating state, and thus extraction (sampling) of the part of the serial data signal (potential D1) is performed. Further, the potential of the data signal DATA_i corresponds to the potential of the data D_i.

Further, after the input of the pulse of the sampling control signal SMP_i ends, the switch PSW_j is turned off, so that the potential of the data D_j is held at the reference potential VR.

Next, as illustrated in FIG. 3C, a pulse of the sampling control signal SMP_j is input to the signal converter circuit, whereby the switch SSW_j of the sample-and-hold circuit SH_j is turned on.

At this time, the value of the potential of the data D_j of the sample-and-hold circuit SH_j is equal to that of the potential of the data signal line DL. The potential of the serial data signal at this time is denoted by a potential D2.

Then, after the input of the pulse of the sampling control signal SMP_j ends, the switch SSW_j is turned off, so that a node whose potential is the data D_j is brought into a floating state, and thus extraction (sampling) of the part of the serial data signal (potential D2) is performed. Further, the potential of the data signal DATA_j corresponds to the potential of the data D_j.

As described above, in the example of the method for driving the signal converter circuit in FIG. 1, the switch SSW which controls a sampling operation of one sample-and-hold circuit and the switch PSW which controls whether or not a potential of held data of another sample-and-hold circuit is set to the reference potential are controlled by the same sampling control signal SMP. Thus, for example, the switch PSW_j is turned on and the potential of the data D_j can be set to the reference potential VR in the sample-and-hold circuit SH_j while the switch SSW_i is turned on and sampling is performed in the sample-and-hold circuit SH_i, so that there is no need to additionally provide a period for setting the potential of the data in the sample-and-hold circuit to the reference potential.

Note that the structure of the signal converter circuit is not limited to that illustrated in FIG. 1. For example, as illustrated in FIG. 4, the signal converter circuit may have a structure in which the plurality of switches PSW each of which controls whether or not the potential of the held data D is set to the reference potential are provided in one sample-and-hold circuit.

Figure 4:
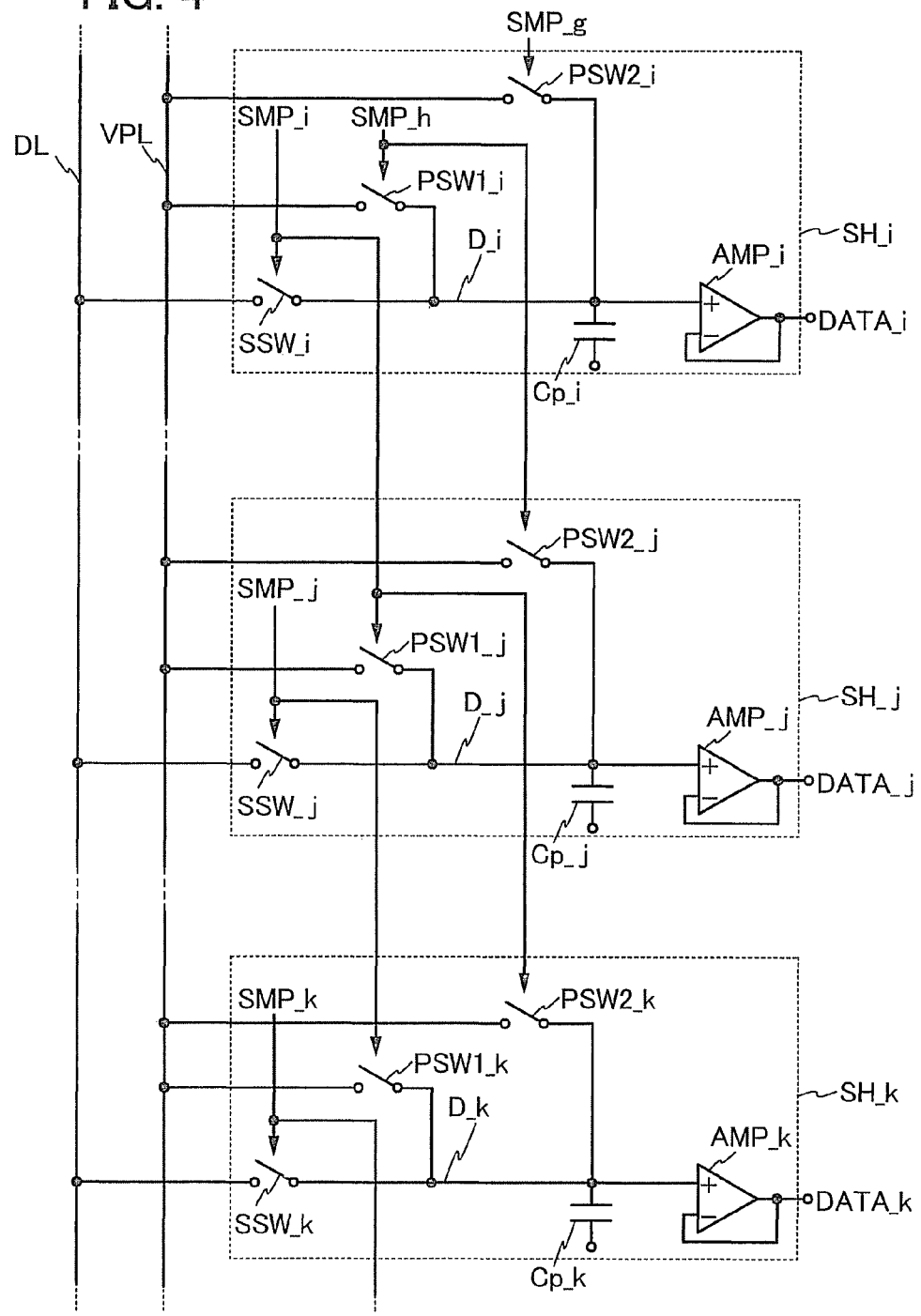
FIG. 4 illustrates an example of a signal converter circuit.

A signal converter circuit illustrated in FIG. 4 includes the sample-and-hold circuit SH_i, the sample-and-hold circuit SH_j, and a sample-and-hold circuit SH_k. It is preferable that the sample-and-hold circuit SH_i, the sample-and-hold circuit SH_j, and the sample-and-hold circuit SH_k be sequentially arranged. However, an embodiment of the present invention is not limited thereto, and another sample-and-hold circuit may be provided between any two of the sample-and-hold circuits SH_i, SH_j, and SH_k. Note that the description of the signal converter circuit in FIG. 1 can be used as appropriate for portions that are the same as those of the signal converter circuit in FIG. 1.

The plurality of sample-and-hold circuits SH each include the switch SSW, the capacitor Cp, the amplifier circuit AMP, a switch PSW1, and a switch PSW2. For example, the sample-and-hold circuit SH_i includes the switch SSW_i, the capacitor Cp_i, the amplifier circuit AMP_i, the switch PSW1_i, and the switch PSW2_i; the sample-and-hold circuit SH_j includes the switch SSW_j, the capacitor Cp_j, the amplifier circuit AMP_j, the switch PSW1_j, and the switch PSW2_j; and the sample-and-hold circuit SH_k includes the switch SSW_k, the capacitor Cp_k, the amplifier circuit AMP_k, the switch PSW1_k, and the switch PSW2_k. In this structure, the switch PSW2_i is turned on or off in accordance with a sampling control signal SMP_g. Note that the structures of the sample-and-hold circuits are not limited to the above, and any structure may be used as long as the sample-and-hold circuit SH_k includes at least the switch PSW1_k and the switch PSW2_k. Alternatively, three or more switches PSW may be provided in order to set the potential of the held data of one sample-and-hold circuit to the reference potential.

In the signal converter circuit illustrated in FIG. 4, the switch PSW1_k has a function of controlling whether a potential of the data D_k is set to the reference potential VR or not in accordance with the sampling control signal SMP_j, and the switch PSW2_k has a function of controlling whether the potential of the data D_k is set to the reference potential VR or not in accordance with the sampling control signal SMP_i. Thus, the potential of the data D of the sample-and-hold circuit SH can be set to the reference potential VR over a plurality of sampling periods. That is, the potential of the data D of the sample-and-hold circuit SH can be set to the reference potential VR over a longer period than one sampling period. Accordingly, even when the sampling rate becomes higher, a period long enough to set the potential of the data D to the reference potential can be ensured before sampling.

Figure 5:
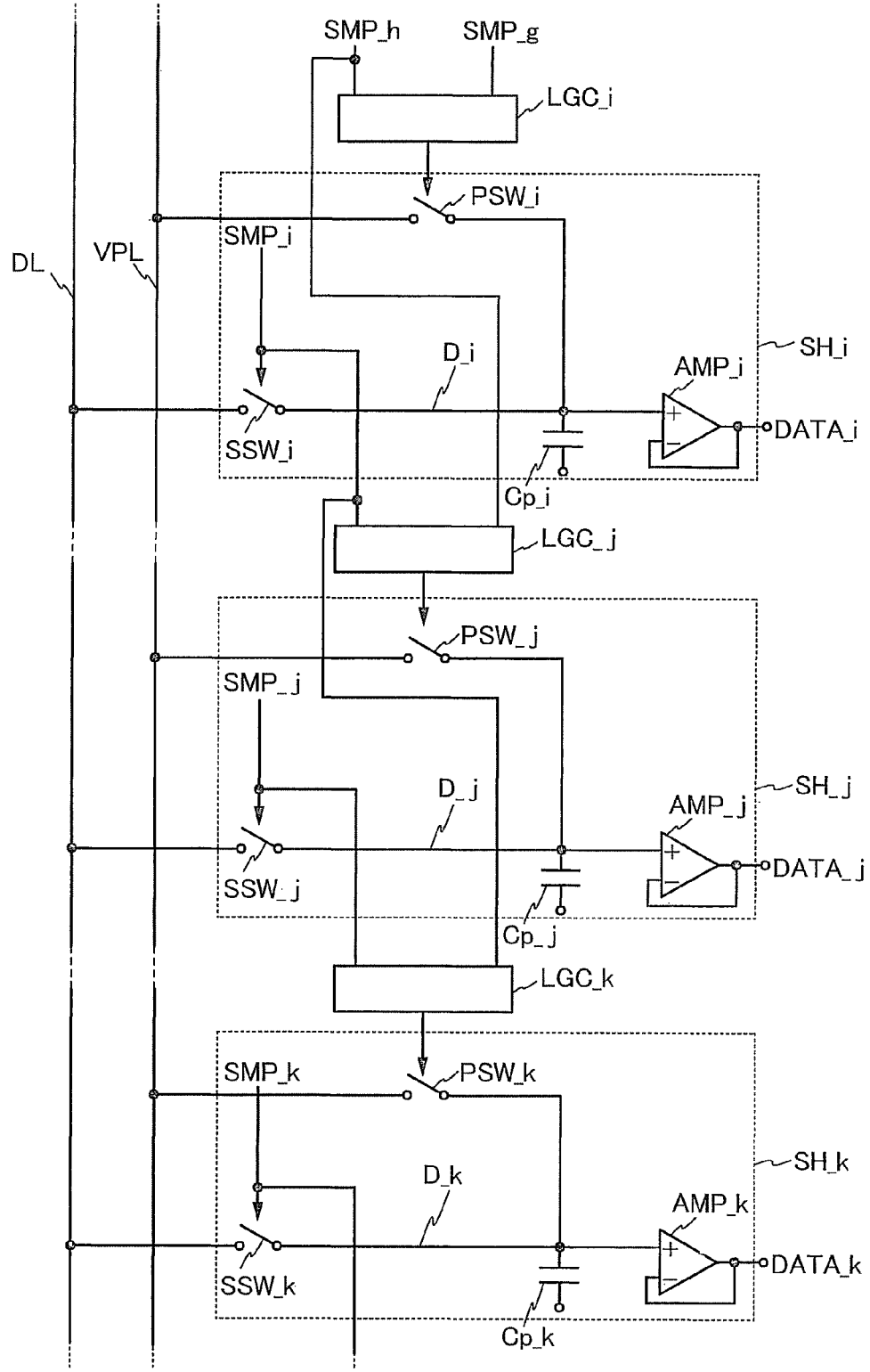
FIG. 5 illustrates an example of a signal converter circuit.

Further, for example, as illustrated in FIG. 5, the signal converter circuit may have a structure in which the switch PSW is controlled by a signal obtained by synthesizing plural sampling control signals with use of a logic circuit.

The signal converter circuit illustrated in FIG. 5 includes the sample-and-hold circuit SH_i, the sample-and-hold circuit SH_j, and the sample-and-hold circuit SH_k. It is preferable that the sample-and-hold circuit SH_i, the sample-and-hold circuit SH_j, and the sample-and-hold circuit SH_k be sequentially arranged. However, an embodiment of the present invention is not limited thereto, and another sample-and-hold circuit may be provided between any two of the sample-and-hold circuits SH_i, SH_j, and SH_k. Note that the description of the signal converter circuit in FIG. 1 can be used as appropriate for portions that are the same as those of the signal converter circuit in FIG. 1.

The plurality of sample-and-hold circuits SH each include the switch SSW, the capacitor Cp, the amplifier circuit AMP, and the switch PSW. For example, the sample-and-hold circuit SH_i includes the switch SSW_i, the capacitor Cp_i, the amplifier circuit AMP_i, and the switch PSW_i; the sample-and-hold circuit SH_j includes the switch SSW_j, the capacitor Cp_j, the amplifier circuit AMP_j, and the switch PSW_j; and the sample-and-hold circuit SH_k includes the switch SSW_k, the capacitor Cp_k, the amplifier circuit AMP_k, and the switch PSW_k. Note that the structures of the sample-and-hold circuits are not limited to the above, and any structure may be used as long as the sample-and-hold circuit SH_k includes at least the switch PSW_k.

The switch PSW_i is turned on or off in accordance with a sampling control signal which is an output signal of a logic circuit LGC_i. A potential of the output signal of the logic circuit LGC_i is a logical OR of the sampling control signal SMP_h and the sampling control signal SMP_g.

The switch PSW_j is turned on or off in accordance with a sampling control signal which is an output signal of a logic circuit LGC_j. A potential of the output signal of the logic circuit LGC_j is a logical OR of the sampling control signal SMP_i and the sampling control signal SMP_h.

The switch PSW_k is turned on or off in accordance with a sampling control signal which is an output signal of a logic circuit LGC_k. A potential of the output signal of the logic circuit LGC_k is a logical OR of the sampling control signal SMP_j and the sampling control signal SMP_i.

As the logic circuit LGC_i, the logic circuit LGC_j, and the logic circuit LGC_k, a logic circuit capable of performing a logical OR operation, such as an OR circuit, can be used, for example. Note that the logic circuit LGC_i, the logic circuit LGC_j, and the logic circuit LGC_k may be provided in the sample-and-hold circuit SH_i, the sample-and-hold circuit SH_j, and the sample-and-hold circuit SH_k, respectively.

Further, an embodiment of the present invention is not limited thereto, and a sampling control signal for controlling the switch PSW may be generated by a logic circuit using three or more kinds of sampling control signals.

In the signal converter circuit illustrated in FIG. 5, the switch PSW_k has a function of controlling whether the potential of the data D_k is set to the reference potential VR or not in accordance with a sampling control signal which is an output signal of the logic circuit LGC_k and whose potential is a logical OR of the sampling control signal SMP_j and the sampling control signal SMP_i. Thus, the potential of the data D of the sample-and-hold circuit SH can be set to the reference potential VR over a plurality of sampling periods. Accordingly, even when the sampling rate becomes higher, a period long enough to set the potential of the data D to the reference potential can be ensured before sampling.

The above is the description of the signal converter circuit in this embodiment.

As described with reference to FIG. 1, FIG. 2, FIGS. 3A to 3C, FIG. 4, and FIG. 5, the signal converter circuit in one example of this embodiment includes a first sample-and-hold circuit (e.g. the sample-and-hold circuit SH_i) and a second sample-and-hold circuit (e.g. the sample-and-hold circuit SH_j), and also includes a switch which controls whether or not a potential of data held in the sample-and-hold circuit is set to a reference potential.

The potential of the held data is set to the reference potential before sampling of the serial data signal, whereby variation in the amount of change in the held data due to the value of the potential of the data held before sampling can be made small. Accordingly, variation in the amount of change in the held data of the sample-and-hold circuit as a result of increase in operation speed can be made small, so that change of the held data can be ignored or correction of the serial data signal corresponding to the amount of change in the held data can be easily performed.

Further, in the signal converter circuit in one example of this embodiment, the switches are controlled using the sampling control signals, whereby the potential of the held data in one sample-and-hold circuit can be set to the reference potential while sampling is performed in another sample-and-hold circuit. This suppresses increase in operation time and decrease in operation speed.

Thus, in the signal converter circuit in one example of this embodiment, an adverse effect of change in the held data of the sample-and-hold circuit as a result of increase in operation speed on a parallel data signal to be generated can be suppressed.

Embodiment 2

In this embodiment, examples of a display device including a signal converter circuit which is one embodiment of the present invention will be described with reference to FIG. 6, FIG. 7, FIG. 8, and FIG. 9.

Figure 6:
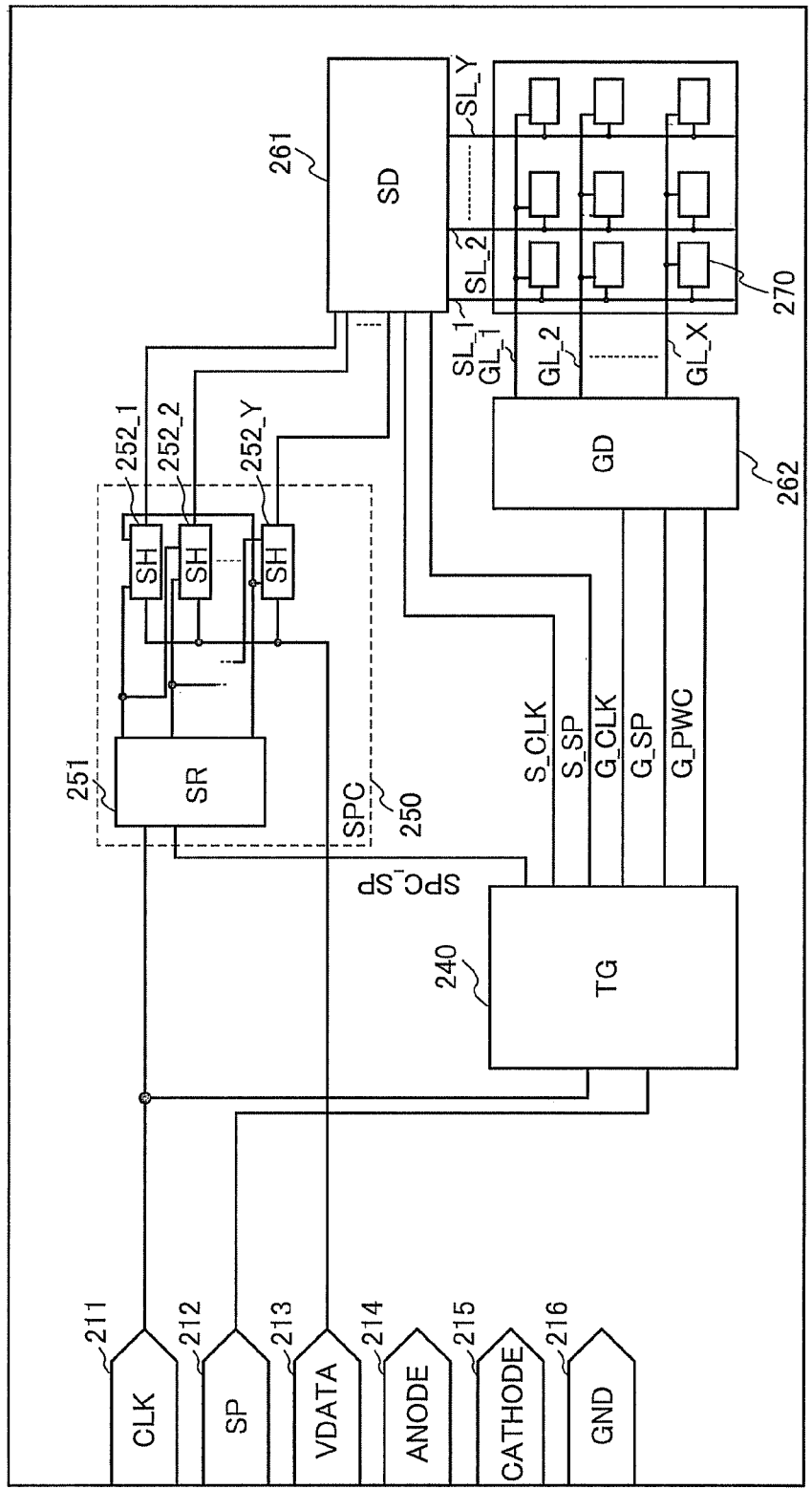
FIG. 6 illustrates a structural example of a display device.

In FIG. 6, a block diagram of a display device in this embodiment is illustrated. The display device illustrated in FIG. 6 includes a clock signal input terminal 211 for inputting a clock signal; a start pulse signal input terminal 212 for inputting a start pulse signal; a data signal input terminal 213 for inputting a data signal; an anode terminal 214 for supplying an anode potential (ANODE); a cathode terminal 215 for supplying a cathode potential (CATHODE); a ground terminal 216 for supplying a ground potential (GND); a control circuit (also referred to as TG) 240; a signal converter circuit (also referred to as SPC) 250; a source driver (also referred to as SD) 261; a gate driver (also referred to as GD) 262; and a plurality of pixel circuits 270. Note that in the display device illustrated in FIG. 6, any of the anode potential, the cathode potential, and the ground potential is supplied as appropriate to the control circuit 240, the signal converter circuit 250, the source driver 261, the gate driver 262, and the plurality of pixel circuits 270 through any of the anode terminal 214, the cathode terminal 215, and the ground terminal 216.

A clock signal CLK and a start pulse signal SP are input to the control circuit 240. For example, the clock signal CLK may be input to the control circuit 240 through the clock signal input terminal 211, and the start pulse signal SP may be input to the control circuit 240 through the start pulse signal input terminal 212.

The control circuit 240 generates and outputs a start pulse signal SPC_SP, a clock signal S_CLK, a start pulse signal S_SP, a clock signal G_CLK, a start pulse signal G_SP, and a plurality of control signals G_PWC in accordance with the clock signal CLK and the start pulse signal SP. Note that as the plurality of control signals G_PWC, a plurality of clock signals having phases different from each other may be generated.

The control circuit 240 has a function of controlling operation of the signal converter circuit 250, the source driver 261, and the gate driver 262.

A video data signal VDATA, the clock signal CLK, and the start pulse signal SPC_SP are input to the signal converter circuit 250. For example, the video data signal VDATA may be input to the signal converter circuit 250 through the data signal input terminal 213, and the clock signal CLK may be input to the signal converter circuit 250 through the clock signal input terminal 211.

The signal converter circuit 250 has a function of converting the input video data signal VDATA into a first to Y-th (Y is a natural number greater than or equal to 2) data signals which is a parallel data signal and outputting them.

The signal converter circuit 250 includes a shift register 251 which generates and outputs a plurality of sampling control signals SMP in accordance with the clock signal CLK and the start pulse signal SPC_SP; and a plurality of sample-and-hold circuits 252 (sample-and-hold circuits 252_1 to 252_Y) in each of which extracting and holding part of the video data signal VDATA is controlled in accordance with any of the plurality of sampling control signals SMP. As each of the sample-and-hold circuits 252_1 to 252_Y, for example, the sample-and-hold circuit SH described in Embodiment 1 can be used. In this structure, the reference potential VR may be generated by dividing a voltage generated by the anode potential and the cathode potential. The clock signal CLK and the start pulse signal SPC_SP are input to the shift register 251. Note that the plurality of shift registers 251 may be provided, and at least one of the sample-and-hold circuits 252_1 to 252_Y may be controlled by a sampling control signal SMP output from one shift register 251, and the rest of them may be each controlled by a sampling control signal SMP output from another shift register 251.

The first to Y-th data signals each of which is part of a parallel data signal, the clock signal S_CLK, and the start pulse signal S_SP are input to the source driver 261. The source driver 261 has a function of sequentially outputting the input first to Y-th data signals in accordance with the clock signal S_CLK and the start pulse signal S_SP.

The clock signal G_CLK, the start pulse signal G_SP, and the plurality of control signals G_PWC are input to the gate driver 262. The gate driver 262 has a function of generating and outputting a plurality of gate signals in accordance with the clock signal G_CLK, the start pulse signal G_SP, and the plurality of control signals G_PWC. In this structure, the plurality of control signals G_PWC are used for controlling the timing of output of pulses of the plurality of gate signals and the pulse widths.

The plurality of gate signals are input to the respective pixel circuits 270 through a plurality of gate signal lines GL (gate signal lines GL_1 to GL_X (X is a natural number greater than or equal to 2)). Further, one of the first to Y-th data signals is input to any of the plurality of pixel circuits 270 in accordance with one of the plurality of gate signals through any of the plurality of source signal lines SL (source signal lines SL_1 to SL_Y). The plurality of pixel circuits 270 is in a display state corresponding to data of the input data signal.

As the pixel circuit 270, for example, a pixel circuit including a liquid crystal element or a pixel circuit including an electroluminescence element (also referred to as EL element) can be used.

Figure 7:
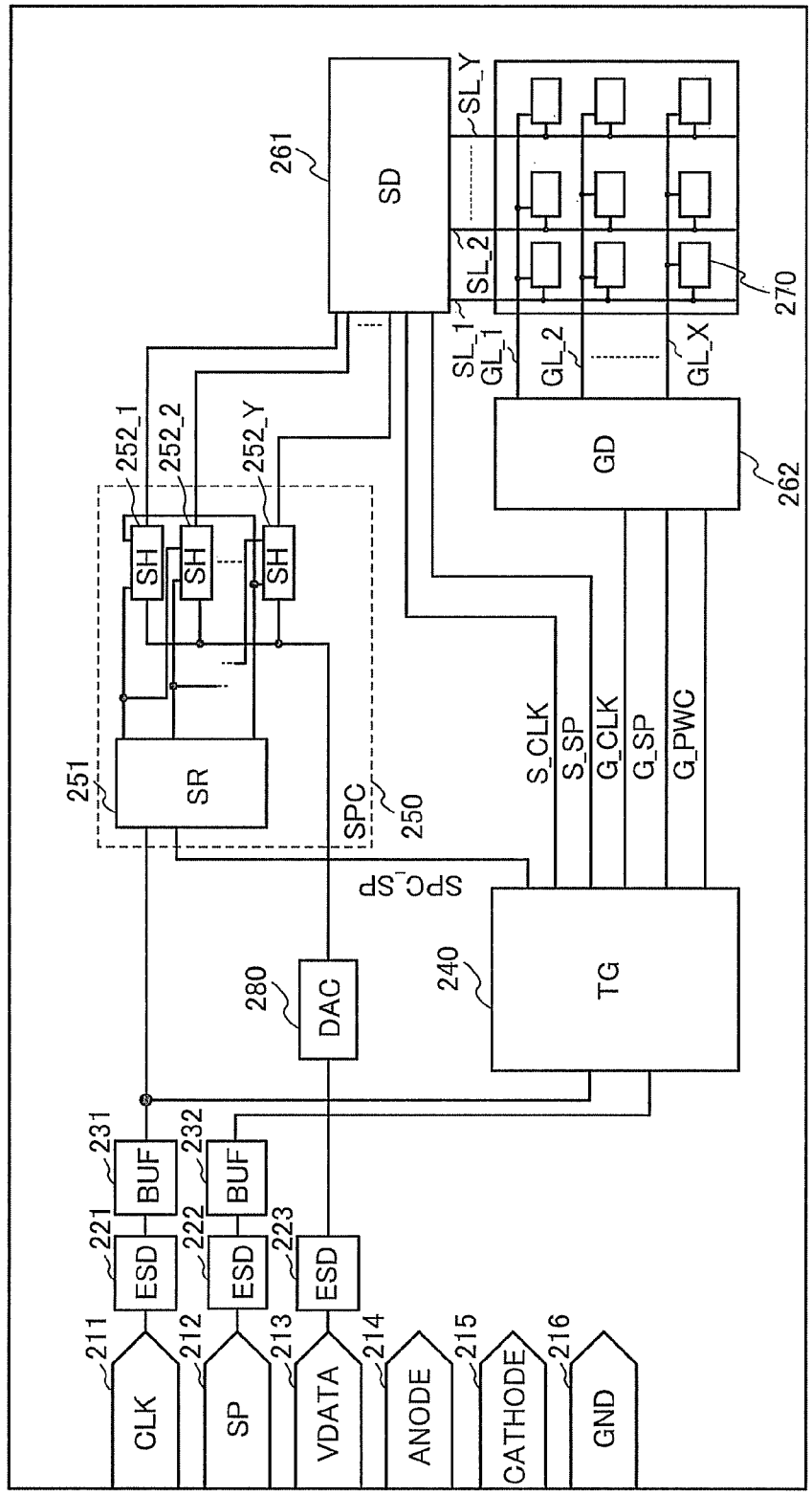
FIG. 7 illustrates a structural example of a display device.

Note that as illustrated in FIG. 7, an electrostatic discharge (ESD) protection circuit 221 and a buffer (also referred to as BUF) circuit 231 may be provided between the clock signal input terminal 211 and the control circuit 240 and between the clock signal input terminal 211 and the signal converter circuit 250. Further, an ESD protection circuit 222 and a buffer circuit 232 may be provided between the start pulse signal input terminal 212 and the control circuit 240.

Further, in the case where the video data signal VDATA is a digital signal, as illustrated in FIG. 7, the video data signal VDATA input to the signal converter circuit 250 may be converted into analog data signal by a digital-analog signal converter circuit (also referred to as DAC) 280. Furthermore, an ESD protection circuit 223 may be provided between the data signal input terminal 213 and the signal converter circuit 250 (or the digital-analog signal converter circuit 280).

As illustrated in FIG. 6 and FIG. 7, each of the examples of the display devices in this embodiment has a structure in which the video data signal is converted into the parallel data signal using the signal converter circuit described in Embodiment 1, whereby the number of the data input terminals can be one. By reducing the number of the terminals, for example, a defect of connection with an external circuit can be unlikely to occur. Further, the number of external circuits to be connected can be reduced.

Further, structural examples of the display devices of this embodiment will be described with reference to schematic cross-sectional views of FIG. 8 and FIG. 9.

Figure 8:
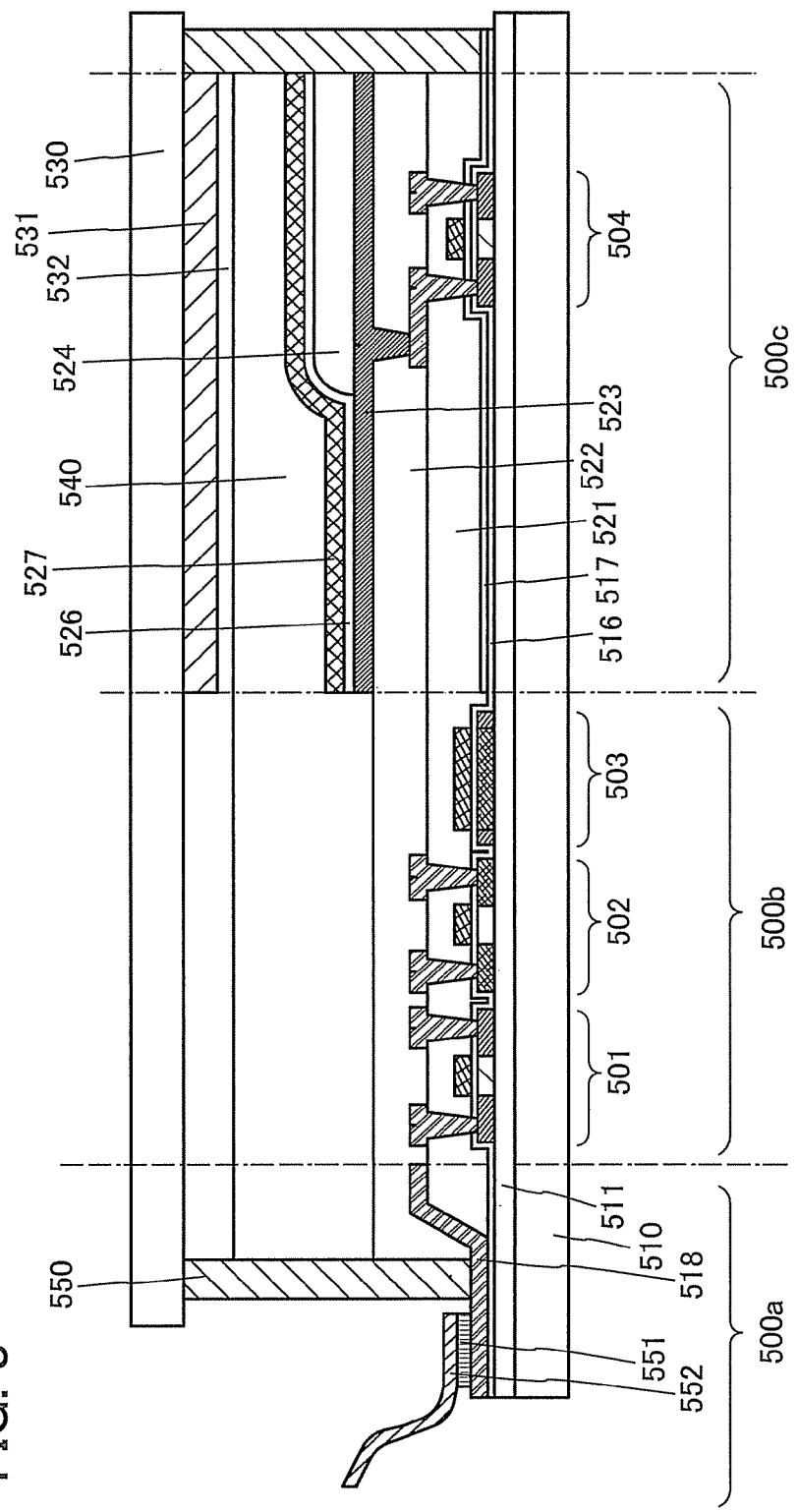
FIG. 8 illustrates a structural example of a display device.

FIG. 8 illustrates a structural example of a top-emission electroluminescent display device (also referred to as EL display device). Note that an embodiment of the present invention is not limited thereto, and the display device of this embodiment may be a bottom-emission or dual-emission EL display device.

In the display device illustrated in FIG. 8, a terminal portion 500a, a peripheral circuit portion 500b, and a pixel portion 500c are formed over a base layer 511 provided over one substrate 510.

Examples of the substrate 510 are a glass substrate, a silicon substrate, and a plastic substrate.

The base layer 511 can be, for example, a layer including an oxide insulating material or a layer including a material such as silicon oxide, silicon oxynitride, or silicon nitride oxide. The base layer 511 can also be formed by stacking layers of materials which can be applied to the base layer 511.

The terminal portion 500a is a region where connection terminals which are connected to external circuits are provided. For example, the clock signal input terminal 211, the start pulse signal input terminal 212, the data signal input terminal 213, the anode terminal 214, the cathode terminal 215, and the ground terminal 216, which are illustrated in FIG. 6, are formed in the terminal portion 500a.

The peripheral circuit portion 500b is a region where circuits for controlling operation of the pixel circuits 270, which are illustrated in FIG. 6, are provided. For example, the control circuit 240, the signal converter circuit 250, the source driver 261, and the gate driver 262, which are illustrated in FIG. 6, are formed in the peripheral circuit portion 500b.

The pixel portion 500c is a region where the pixel circuits 270 illustrated in FIG. 6 are provided.

The display device illustrated in FIG. 8 will be further described below.

The display device illustrated in FIG. 8 includes a transistor 501, a transistor 502, and a capacitor 503, which are provided in the peripheral circuit portion 500b, and a transistor 504 which is provided in the pixel portion 500c.

The transistor 501 and the transistor 502 are field-effect transistors having conductivity types different from each other. For example, in the case where the transistor 501 is an n-channel transistor, the transistor 502 is a p-channel transistor. In this case, an insulating layer 516 serves as a gate insulating layer of the transistor 501 and the transistor 502. Note that the plurality of transistors 501 and the plurality of transistors 502 may be provided in the display device illustrated in FIG. 8. The transistor 501 and the transistor 502 are each a transistor included in any of the control circuit 240, the signal converter circuit 250, the source driver 261, and the gate driver 262. For example, in the case where the switch SSW or the switch PSW of the signal converter circuit in Embodiment 1 is an analog switch, the analog switch may be formed using the transistor 501 and the transistor 502.

The capacitor 503 is formed using the same semiconductor film as channel formation layers of the transistor 501 and the transistor 502, and includes a semiconductor layer to which an impurity element imparting a conductivity type is added, the insulating layer 516, and a conductive layer formed using the same conductive film as conductive layers serving as gates of the transistor 501 and the transistor 502. In this structure, the insulating layer 516 functions as a dielectric layer of the capacitor 503. The capacitor 503 is included in, for example, any of the sample-and-hold circuits 252_1 to 252_Y of the signal converter circuit 250.

The transistor 504 is included in the pixel circuit 270. In this structure, the insulating layer 516 and an insulating layer 517 each serve as a gate insulating layer of the transistor 504. Accordingly, the gate insulating layer of the transistor 504 is thicker than those of the transistor 501 and the transistor 502. Thus, while decrease in operation speed of the transistor 501 and the transistor 502 is suppressed, the withstand voltage of the transistor 504 can be improved.

Each of the insulating layer 516 and the insulating layer 517 can be, for example, a layer including a material such as silicon oxide, silicon nitride, silicon oxynitride, silicon nitride oxide, aluminum oxide, aluminum nitride, aluminum oxynitride, aluminum nitride oxide, or hafnium oxide. Further, each of the insulating layer 516 and the insulating layer 517 can be a stack of layers that can be used for the insulating layer 516 and the insulating layer 517.

As a conductive layer serving as a source or a drain of each of the transistor 501, the transistor 502, and the transistor 504 or a conductive layer serving as a gate thereof, for example, a layer including a metal material such as molybdenum, titanium, chromium, tantalum, magnesium, silver, tungsten, aluminum, copper, neodymium, or scandium can be used. As the conductive layer, a layer including a conductive metal oxide can also be used. The conductive metal oxide can be, for example, a metal oxide such as indium oxide ($In_2O_3$), tin oxide ($SnO_2$), zinc oxide (ZnO), indium tin oxide ($In_2O_3$—$SnO_2$, which is abbreviated to ITO in some cases), or indium zinc oxide ($In_2O_3$—ZnO); or the metal oxide containing silicon, silicon oxide, or nitrogen. Alternatively, the conductive layer can be a stack of layers of materials which can be applied to the conductive layer.

Further, the transistor 501, the transistor 502, and the transistor 504 each include, for example, a single crystal semiconductor layer (e.g. single crystal silicon) where a channel is formed. A channel formation region of each of the transistors is formed using a single crystal semiconductor layer, whereby the mobility of each of the transistor 501, the transistor 502, and the transistor 504 can be increased, which leads to increase in operation speed of the respective circuits. Note that the channel formation region of each of the transistors may be formed using an oxide semiconductor layer, or the like.

Here, an example of forming the single crystal semiconductor layer will be described below.

For example, the substrate 510 and a semiconductor substrate provided with an insulating layer on its upper surface are prepared. Note that an oxide insulating layer or a nitride insulating layer may be formed over the substrate 510 in advance.

For example, the insulating layer can be formed over the semiconductor substrate by formation of an oxide insulating film by a thermal oxidation method, a CVD method, a sputtering method, or the like.

In addition, an ion beam including ions which are accelerated by an electric field enters the semiconductor substrate and a fragile region is formed in a region at a certain depth from a surface of, the semiconductor substrate. Note that the depth at which the fragile region is formed is adjusted by the kinetic energy, mass, electrical charge, or incidence angle of the ions, or the like.

For example, ions can be introduced into the semiconductor substrate with the use of an ion doping apparatus or an ion implantation apparatus.

As ions used for irradiation, for example, hydrogen and/or helium can be used. For example, in the case where irradiation is performed with hydrogen ions using an ion doping apparatus, the efficiency of irradiation of ions can be improved by increasing the proportion of $H_3^+$ in the ions used for irradiation. Specifically, it is preferable that the proportion of $H_3^+$ be higher than or equal to 50% (more preferably, higher than or equal to 80%) with respect to the total amount of $H^+$, $H_2^+$, and $H_3^+$.

Further, the substrate 510 and the semiconductor substrate are attached to each other with the insulating layer which is provided on the semiconductor substrate provided therebetween. Note that in the case where the substrate 510 is also provided with an insulating layer, the substrate 510 and the semiconductor substrate are bonded to each other with the insulating layer which is provided over the semiconductor substrate and the insulating layer which is provided over the substrate 510 provided therebetween. In this structure, the insulating layers provided between the substrate 510 and the semiconductor substrate serve as the base layer 511.

Furthermore, heat treatment is performed so that the semiconductor substrate is separated with the fragile region used as a cleavage plane. Thus, the semiconductor layer can be formed over the base layer 511. Note that when a surface of the semiconductor layer is irradiated with laser light, the flatness of the surface of the semiconductor layer can be improved. Further, part of the semiconductor layer is etched, whereby the single crystal semiconductor layer can be formed.

Further, an impurity element imparting a conductivity type is added to the single crystal semiconductor layer, whereby a source region and a drain region are formed. For example, an impurity element imparting n-type conductivity (e.g., phosphorus) is added in the case of an n-channel transistor, and an impurity element imparting p-type conductivity (e.g., boron) is added in the case of a p-channel transistor.

The above is the description of the example of forming the single crystal semiconductor layer.

The display device illustrated in FIG. 8 further includes an insulating layer 521 and a conductive layer 518.

The insulating layer 521 is provided over the transistor 501, the transistor 502, the capacitor 503, and the transistor 504. The insulating layer 521 has a function as a planarization layer. The insulating layer 521 can be an organic insulating layer or an inorganic insulating layer, for example.

The conductive layer 518 has a function as a terminal electrode. The conductive layer 518 is electrically connected to a flexible printed circuit (also referred to as FPC) 552 through an anisotropic conductive layer 551, for example. The conductive layer 518 is formed using the same conductive film as that of a conductive layer serving as a source or a drain of each of the transistor 501, the transistor 502, and the transistor 504.

The display device illustrated in FIG. 8 further includes an insulating layer 522; a conductive layer 523 provided over the insulating layer 522 in the pixel portion 500c; an insulating layer 524 provided over the conductive layer 523; a light-emitting layer 526 in contact with the conductive layer 523 in an opening which is provided so as to penetrate the insulating layer 524; and a conductive layer 527 provided over the light-emitting layer 526.

The insulating layer 522 is provided over the insulating layer 521 so as to cover the conductive layer 518 and the conductive layers serving as the source or the drain of each of the transistor 501, the transistor 502, and the transistor 504. The insulating layer 522 has a function as a planarization layer. The insulating layer 522 can be an organic insulating layer or an inorganic insulating layer, for example.

The conductive layer 523 is in contact with the conductive layer serving as the source or the drain of the transistor 504 through an opening which is provided so as to penetrate the insulating layer 522. The conductive layer 523 serves as one of a pair of electrodes of an EL element. The conductive layer 523 has a function of reflecting light. The conductive layer 523 can be a layer including a material which reflects light and is applicable to the conductive layers of the transistor 501, the transistor 502, and the transistor 504.

The insulating layer 524 is provided so as to cover a connection portion between the conductive layer 523 and the conductive layer serving as the source or the drain of the transistor 504. For the insulating layer 524, a resin material can be used, for example.

The light-emitting layer 526 serves as a light-emitting layer of the EL element. As the light-emitting layer 526, for example, a light-emitting layer using a light-emitting material which emits light of a specific color can be used. The light-emitting layer 526 can also be formed using a stack of light-emitting layers which emit light of different colors. As the light-emitting material, an electroluminescent material (also referred to as an EL material) such as a fluorescent material or a phosphorescent material can be used. Alternatively, the light-emitting material can be formed using a material containing a plurality of EL materials. A light-emitting layer emitting white light may be formed with a stack of a layer of a fluorescent material emitting blue light, a layer of a first phosphorescent material emitting orange light, and a layer of a second phosphorescent material emitting orange light, for example. Further, as the EL material, an organic EL material or an inorganic EL material can be used. Alternatively, the light-emitting layer 526 may be formed using, for example, in addition to the layer containing the above-described light-emitting material, one or more of the following layers: a hole-injection layer, a hole-transport layer, an electron-transport layer, and an electron-injection layer.

The conductive layer 527 serves as the other of the pair of electrodes of the EL element. The conductive layer 527 has a function of transmitting light. As the conductive layer 527, a layer containing a material which transmits light and is applicable to the conductive layers of the transistor 501, the transistor 502, and the transistor 504, can be used, for example.

The display device illustrated in FIG. 8 further includes a coloring layer 531 provided over one surface of a substrate 530 and an insulating layer 532 provided over the one surface of the substrate 530 with the coloring layer 531 interposed therebetween.

As the substrate 530, a substrate applicable to the substrate 510 can be used.

The coloring layer 531 serves as a color filter which transmits light within the wavelength range of red, light within the wavelength range of green, or light within the wavelength range of blue, which is included in light emitted from the EL element. Further, the coloring layer 531 may have a function of transmitting cyan light, magenta light, or yellow light. As the coloring layer 531, for example, a layer including a dye or a pigment can be used. When containing dye, the coloring layer 531 is formed by a photolithography method, a printing method, or an inkjet method, for example. When containing pigment, the coloring layer 531 is formed by a photolithography method, a printing method, an electrodeposition method, an electrophotographic method, or the like. By using the inkjet method, for example, the coloring layer can be manufactured at room temperature, manufactured at a low vacuum, or formed over a large substrate. Since the coloring layer can be manufactured without a resist mask, manufacturing cost and the number of steps can be reduced.

The insulating layer 532 has a function as a planarization layer. The insulating layer 532 can be a layer of a material which can be used for the insulating layer 521, for example.

The EL element of the display device illustrated in FIG. 8 includes the conductive layer 523, the light-emitting layer 526, and the conductive layer 527.

Further, the EL element is sealed between the substrate 510 and the substrate 530 together with a filler 540 using a sealant 550.

As the filler 540, an inert gas such as nitrogen or argon, an ultraviolet curable resin, or a thermosetting resin, can be used, for example.

In FIG. 8, portions corresponding to the sealant 550 are all indicated by the same hatching pattern, and the EL element is formed in a region sealed so as to be surrounded by the sealant 550.

The above is the description of the structural example of the display device illustrated in FIG. 8.

Figure 9:
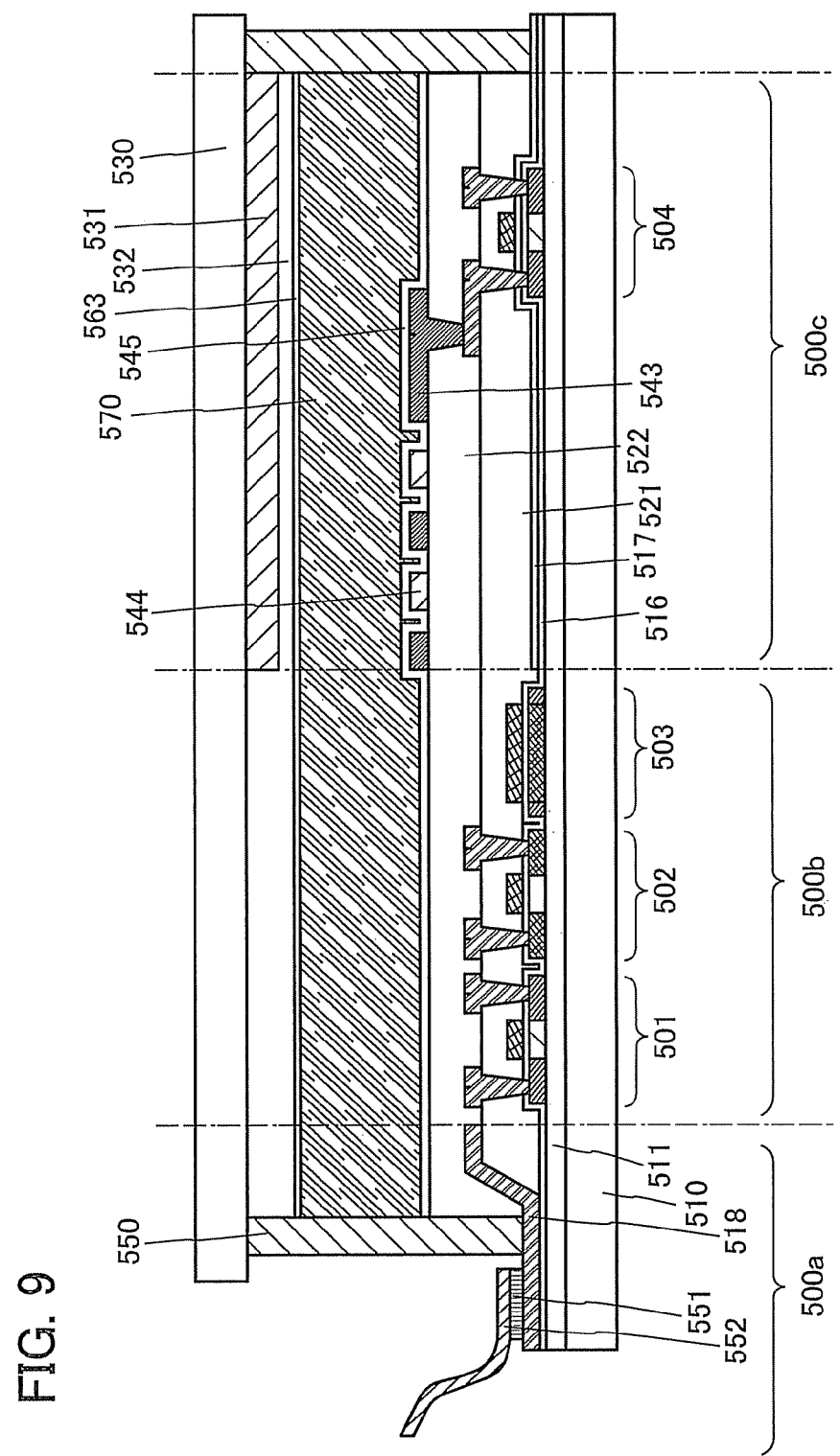
FIG. 9 illustrates a structural example of a display device.

Note that the display device of this embodiment is not limited to an EL display device and may be a liquid crystal display device as illustrated in FIG. 9, for example.

FIG. 9 illustrates a structural example of a liquid crystal display device of a horizontal electric field mode. Note that the structure of the display device of this embodiment is not limited thereto, and the display device of this embodiment may be a liquid crystal display device of a vertical electric field mode.

The liquid crystal display device illustrated in FIG. 9 includes a conductive layer 543, a conductive layer 544, an insulating layer 545 provided over the conductive layer 543 and the conductive layer 544, an insulating layer 563, and a liquid crystal layer 570 instead of the conductive layer 523, the insulating layer 524, the light-emitting layer 526, the conductive layer 527, and the filler 540, which are illustrated in FIG. 8.

The conductive layer 543 and the conductive layer 544 each have a comb shape. For example, teeth of the conductive layer 543 and teeth of the conductive layer 544 are alternately provided in parallel. In FIG. 9, portions corresponding to the conductive layer 543 are all indicated by the same hatching pattern. Further, portions corresponding to the conductive layer 544 are all indicated by the same hatching pattern. Furthermore, the conductive layer 543 and the conductive layer 544 overlap with the coloring layer 531. The conductive layer 543 and the conductive layer 544 serve as a pair of electrodes of a liquid crystal element. The conductive layer 543 and the conductive layer 544 can be a layer of metal oxide which transmits light, for example. For example, metal oxide including indium can be used. The conductive layer 543 and the conductive layer 544 can be a stack of layers of materials applicable to the conductive layer 543 and the conductive layer 544.

The insulating layer 545 and the insulating layer 563 each serve as a protection layer. Each of the insulating layer 545 and the insulating layer 563 can be a layer of a material applicable to the insulating layer 516 and the insulating layer 517.

The liquid crystal layer 570 can be a layer including liquid crystal exhibiting a blue phase, for example.

A layer including liquid crystal exhibiting a blue phase contains a liquid crystal composition including liquid crystal exhibiting a blue phase, a chiral material, a liquid-crystalline monomer, a non-liquid-crystalline monomer, and a polymerization initiator. The liquid crystal exhibiting a blue phase has a short response time, and has optical isotropy that contributes to the exclusion of the alignment process and reduction of viewing angle dependence. Therefore, the use of the liquid crystal exhibiting a blue phase makes it possible to operate the liquid crystal display device at a high speed. Further, one embodiment of the present invention is not limited thereto, a liquid crystal layer containing a thermotropic liquid crystal, a low-molecular liquid crystal, a polymer liquid crystal, a polymer-dispersed liquid crystal, a ferroelectric liquid crystal, an anti-ferroelectric liquid crystal, or the like may be used. Such a liquid crystal material exhibits a cholesteric phase, a smectic phase, a cubic phase, a chiral nematic phase, an isotropic phase, or the like depending on conditions.

The liquid crystal element of the liquid crystal display device illustrated in FIG. 9 includes the conductive layer 543, the liquid crystal layer 570, and the conductive layer 544.

The above is the description of the display device illustrated in FIG. 9.

As described with reference to FIG. 6, FIG. 7, FIG. 8, and FIG. 9, in each of the examples of the display devices of this embodiment, the terminal portion, the peripheral circuit portion, and the pixel portion can be formed over one substrate using the transistors in each of which a single crystal semiconductor layer is used for a channel formation region. Thus, the number of wirings between the respective circuits can be reduced, which suppresses poor connection or the like.

Further, in each of the examples of the display devices of this embodiment, a video data signal is converted into a parallel data signal using the signal converter circuit described in Embodiment 1. Thus, the number of the data signal input terminals can be reduced.

Embodiment 3

In this embodiment, examples of an electronic device in which a housing is provided with a panel including any of the display devices in Embodiment 2 will be described with reference to FIGS. 10A to 10D.

Figure 10A:
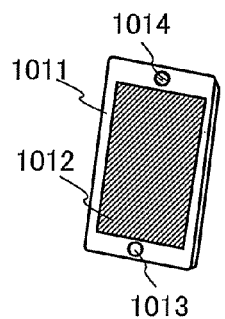
FIGS. 10A to 10D each illustrate an example of an electronic device.

An electronic device illustrated in FIG. 10A is an example of a portable information terminal.

The electronic device illustrated in FIG. 10A has a housing 1011 and a panel 1012, a button 1013, and a speaker 1014 that are provided for the housing 1011.

Note that the housing 1011 may be provided with a connection terminal for connecting the electronic device illustrated in FIG. 10A to an external device and/or a button used to operate the electronic device illustrated in FIG. 10A.

The panel 1012 functions as a display panel and a touch panel. The panel 1012 can be a panel formed by superposing a touch panel on the display device described in Embodiment 2.

The button 1013 is provided for the housing 1011. For example, when a power button is provided as the button 1013, the electronic device can be turned on or off by pressing the button 1013.

The speaker 1014 is provided for the housing 1011. The speaker 1014 has a function of outputting sound.

Note that the housing 1011 may be provided with a microphone, in which case the electronic device illustrated in FIG. 10A can function as a telephone.

The electronic device illustrated in FIG. 10A functions as one or more of a telephone set, an e-book reader, a personal computer, and a game machine, for example.

Figure 10B:
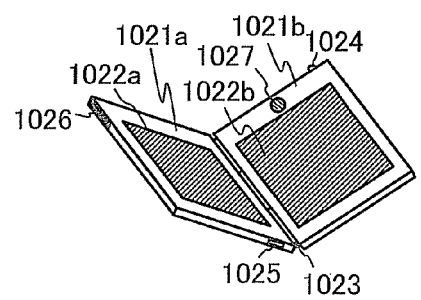

An electronic device illustrated in FIG. 10B is an example of a folding digital assistant.

The electronic device illustrated in FIG. 10B has a housing 1021a, a housing 1021b, a panel 1022a provided for the housing 1021a, a panel 1022b provided for the housing 1021b, a hinge 1023, a button 1024, a connection terminal 1025, a storage medium inserting portion 1026, and a speaker 1027.

The housing 1021a and the housing 1021b are connected with the hinge 1023.

The panels 1022a and 1022b each function as a display panel and a touch panel. Each of the panels 1022a and 1022b can be a panel formed by superposing a touch panel on the display device described in Embodiment 2.

Since the electronic device illustrated in FIG. 10B has the hinge 1023, the housing 1021a or the housing 1021b can be moved to overlap the housing 1021a with the housing 1021b, for example; that is, the electronic device can fold.

The button 1024 is provided for the housing 1021b. Note that the housing 1021a may be provided with the button 1024. For example, when the button 1024 which functions as a power button is provided and pushed, whether power is supplied to circuits in the electronic device can be controlled.

The connection terminal 1025 is provided for the housing 1021a. Note that the housing 1021b may be provided with the connection terminal 1025. Alternatively, a plurality of connection terminals 1025 may be provided for one or both of the housings 1021a and 1021b. The connection terminal 1025 is a terminal for connecting the electronic device illustrated in FIG. 10B to another device.

The storage medium inserting portion 1026 is provided for the housing 1021a. Note that the storage medium insertion portion 1026 may be provided for the housing 1021b. Alternatively, the plurality of storage medium insertion portions 1026 may be provided for one or both of the housings 1021a and 1021b. For example, when a card storage medium is inserted into the storage medium insertion portion, data can be read from the card storage medium and written to the electronic device, or data can be read from the electronic device and written to the card storage medium.

The speaker 1027 is provided for the housing 1021b. The speaker 1027 has a function of outputting sound. Note that the speaker 1027 may be provided for the housing 1021a instead of the housing 1021b.

Note that the housing 1021a or 1021b may be provided with a microphone, in which case the electronic device illustrated in FIG. 10B can function as a telephone.

The electronic device illustrated in FIG. 10B functions as one or more of a telephone set, an e-book reader, a personal computer, and a game machine, for example.

Figure 10C:
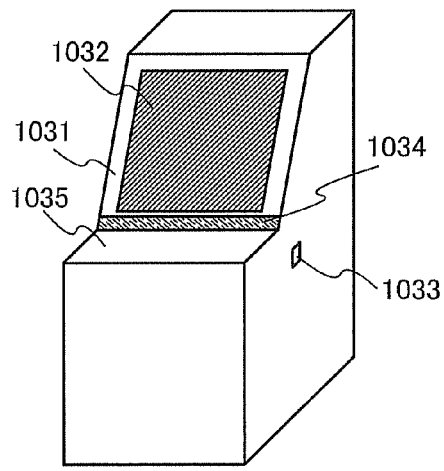

An electronic device illustrated in FIG. 10C is an example of a stationary information terminal. The stationary information terminal illustrated in FIG. 10C has a housing 1031, and a panel 1032, a button 1033, and a speaker 1034 that are provided for the housing 1031.

The panel 1032 functions as a display panel and a touch panel. The panel 1032 can be a panel formed by superposing a touch panel on the display device described in Embodiment 2.

Note that the panel 1032 can be provided for a deck portion 1035 of the housing 1031.

The housing 1031 may be provided with one or more of a ticket slot from which a ticket or the like is dispensed, a coin slot, and a bill slot.

The button 1033 is provided for the housing 1031. For example, when the button 1033 which functions as a power button is provided and pushed, whether power is supplied to circuits in the electronic device can be controlled.

The speaker 1034 is provided for the housing 1031. The speaker 1034 has a function of outputting sound.

The electronic device illustrated in FIG. 10C functions as, for example, an automated teller machine, an information communication terminal for ordering a ticket or the like (also referred to as a multi-media station), or a game machine.

Figure 10D:
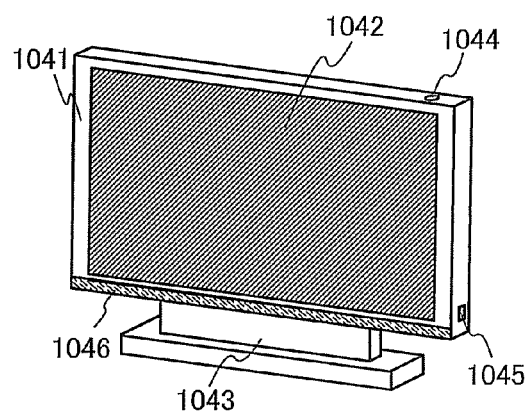

FIG. 10D illustrates an example of a stationary information terminal. The electronic device illustrated in FIG. 10D has a housing 1041, and a panel 1042, a button 1044, a connection terminal 1045, and a speaker 1046 that are provided for the housing 1041, and a support base 1043 supporting the housing 1041.

Note that a connection terminal for connecting the housing 1041 to an external device and/or a button used to operate the electronic device illustrated in FIG. 10D may be provided.

The panel 1042 functions as a display panel. The display device in Embodiment 2 can be applied to the panel 1042.

The panel 1042 may also function as a touch panel by superposing a touch panel on the display device described in Embodiment 2.

The button 1044 is provided for the housing 1041. For example, when the button 1044 which functions as a power button is provided and pushed, whether power is supplied to circuits in the electronic device can be controlled.

The connection terminal 1045 is provided for the housing 1041. The connection terminal 1045 is a terminal for connecting the electronic device illustrated in FIG. 10D to another device. For example, connecting the electronic device illustrated in FIG. 10D and a personal computer with the connection terminal 1045 enables the panel 1042 to display an image corresponding to a data signal input from the personal computer. For example, when the panel 1042 of the electronic device illustrated in FIG. 10D is larger than a panel of an electronic device connected thereto, a displayed image of the electronic device can be enlarged, in which case a plurality of viewers can recognize the image at the same time with ease.

The speaker 1046 is provided for the housing 1041. The speaker 1046 has a function of outputting sound.

The electronic device illustrated in FIG. 10D functions as, for example, an output monitor, a personal computer, or a television set.

As described with reference to FIGS. 10A to 10D, by using any of the display devices in Embodiment 2 for panels, increase in operation speed can be achieved and poor connection or the like in the panels can be suppressed, so that the electronic devices can have higher reliability.

This application is based on Japanese Patent Application serial no. 2011-282430 filed with Japan Patent Office on Dec. 23, 2011, the entire contents of which are hereby incorporated by reference.

What is claimed is:

1. A signal converter circuit comprising:
   a data signal line;
   a reference potential line;
   a first sample-and-hold circuit comprising:
      a first amplifier circuit comprising a first positive input terminal, a first negative input terminal, and a first output terminal;
      a first switch electrically connected to the data signal line and directly connected to the first positive input terminal; and
      a first capacitor directly connected to the first switch and the first positive input terminal; and
   a second sample-and-hold circuit comprising:
      a second amplifier circuit comprising a second positive input terminal, a second negative input terminal, and a second output terminal;
      a second switch electrically connected to the reference potential line and directly connected to the second positive input terminal;
      a third switch electrically connected to the data signal line and directly connected to the second positive input terminal; and
      a second capacitor directly connected to the second switch, the third switch, and the second positive input terminal,
   wherein the first negative input terminal and the first output terminal are electrically connected to each other,
   wherein the second negative input terminal and the second output terminal are electrically connected to each other, and
   wherein the first switch and the second switch are turned on simultaneously with a same signal.

2. The signal converter circuit according to claim 1,
wherein the first switch is a first transistor,
wherein the second switch is a second transistor,
wherein the third switch is a third transistor, and
wherein a source or a drain of the first transistor and a source or a drain of the third transistor are electrically connected to the data signal line.

3. The signal converter circuit according to claim 1,
wherein the first switch is a first transistor,
wherein the second switch is a second transistor, and
wherein a gate of the first transistor and a gate of the second transistor are electrically connected to each other.

4. The signal converter circuit according to claim 1,
wherein a structure of the second switch is the same as a structure of the third switch.

5. A display device comprising:
a signal converter circuit according to claim 1;
a gate driver;
a source driver electrically connected to the signal converter circuit; and
a control circuit electrically connected to the signal converter circuit, the source driver, and the gate driver.

6. The display device according to claim 5,
wherein the signal converter circuit, the source driver, the gate driver, and the control circuit are provided over one substrate.

7. An electronic device comprising a panel including the display device according to claim 6.

8. The signal converter circuit according to claim 1, further comprising a node directly connected to the second switch, the third switch, and the second capacitor,
wherein the node is connected to one of a terminal of the second switch, one of a terminal of the third switch, and one of an electrode of the second capacitor.

9. A signal converter circuit comprising:
a first sample-and-hold circuit comprising:
  a first amplifier circuit comprising a first positive input terminal, a first negative input terminal, and a first output terminal;
  a first capacitor directly connected to the first positive input terminal; and
  a first switch directly connected to the first positive input terminal and configured to control whether or not first data is held in the first capacitor; and
a second sample-and-hold circuit comprising:
  a second amplifier circuit comprising a second positive input terminal, a second negative input terminal, and a second output terminal;
  a second capacitor directly connected to the second positive input terminal;
  a second switch directly connected to the second positive input terminal and configured to control whether or not a potential of the second capacitor is set to a reference potential; and
  a third switch directly connected to the second positive input terminal and configured to control whether or not second data is held in the second capacitor; and
wherein the first negative input terminal and the first output terminal are electrically connected to each other,
wherein the second negative input terminal and the second output terminal are electrically connected to each other, and
wherein a terminal for controlling the first switch is electrically connected to a terminal for controlling the second switch through a wiring, and
wherein the first switch and the second switch are turned on simultaneously with a same signal.

10. The signal converter circuit according to claim 9,
wherein the first switch is a first transistor,
wherein the second switch is a second transistor, and
wherein a gate of the first transistor is electrically connected to a gate of the second transistor.

11. A display device comprising the signal converter circuit according to claim 9.

12. An electronic device comprising a panel including the display device according to claim 11.

13. The signal converter circuit according to claim 9, further comprising a node directly connected to the second switch, the third switch, and the second capacitor,
wherein the node is connected to one of a terminal of the second switch, one of a terminal of the third switch, and one of an electrode of the second capacitor.

* * * * *